(12) United States Patent
Czabaj et al.

(10) Patent No.: US 8,872,289 B2
(45) Date of Patent: Oct. 28, 2014

(54) MICRO-ELECTRO-MECHANICAL SYSTEM (MEMS) STRUCTURES AND DESIGN STRUCTURES

(71) Applicant: International Business Machines Corporation, Armonk, NY (US)

(72) Inventors: Brian M. Czabaj, Essex Junction, VT (US); David A. DeMuynck, Underhill, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/758,447

(22) Filed: Feb. 4, 2013

(65) Prior Publication Data

US 2013/0154033 A1    Jun. 20, 2013

Related U.S. Application Data

(62) Division of application No. 13/326,604, filed on Dec. 15, 2011, now Pat. No. 8,673,670.

(51) Int. Cl.
*H01L 29/84* (2006.01)
*B81C 1/00* (2006.01)
*G06F 17/50* (2006.01)
*H01H 57/00* (2006.01)

(52) U.S. Cl.
CPC ............ *H01L 29/84* (2013.01); *B81B 2201/014* (2013.01); *B81B 2203/0118* (2013.01); *H01H 2057/006* (2013.01); *B81C 1/00246* (2013.01); *G06F 17/5068* (2013.01)

USPC ..... 257/415; 257/417; 257/532; 257/E29.324

(58) Field of Classification Search
CPC ............ H01L 29/84; H01H 2057/006; B81B 2201/014; B81B 2203/0118; B81B 2203/01; B81B 2203/04; B81C 1/00246; B81C 1/00476
USPC ................... 257/415, 417, 254, 532, E29.324
See application file for complete search history.

(56) References Cited

U.S. PATENT DOCUMENTS

| 6,800,503 B2 | 10/2004 | Kocis et al. |
| 6,917,086 B2 | 7/2005 | Cunningham et al. |
| 6,958,478 B2 * | 10/2005 | Terre et al. ................. 250/338.2 |
| 7,785,912 B2 | 8/2010 | Zhan et al. |
| 7,864,006 B2 | 1/2011 | Foster et al. |

(Continued)

OTHER PUBLICATIONS

Office Action for related U.S. Appl. 13/326,604 dated Feb. 20, 2013.

(Continued)

*Primary Examiner* — Michael Trinh
(74) *Attorney, Agent, or Firm* — Anthony Canale; Roberts Mlotkowski Safran & Cole, P.C.

(57) ABSTRACT

Micro-Electro-Mechanical System (MEMS) structures, methods of manufacture and design structures are disclosed. The method includes layering metal and insulator materials on a sacrificial material formed on a substrate. The method further includes masking the layered metal and insulator materials. The method further includes forming an opening in the masking which overlaps with the sacrificial material. The method further includes etching the layered metal and insulator materials in a single etching process to form the beam structure, such that edges of the layered metal and insulator material are aligned. The method further includes forming a cavity about the beam structure through a venting.

10 Claims, 4 Drawing Sheets

(56) References Cited

U.S. PATENT DOCUMENTS

| | | |
|---|---|---|
| 2001/0040675 A1 | 11/2001 | True et al. |
| 2007/0114643 A1* | 5/2007 | Dcamp et al. ................ 257/678 |
| 2008/0017489 A1* | 1/2008 | Kawakubo et al. ........... 200/181 |
| 2010/0140669 A1* | 6/2010 | Xie ............................... 257/254 |
| 2010/0181631 A1 | 7/2010 | Lacey |
| 2010/0330722 A1 | 12/2010 | Hsieh et al. |
| 2011/0049649 A1 | 3/2011 | Anderson et al. |
| 2011/0318861 A1* | 12/2011 | Jahnes et al. ................... 438/52 |
| 2014/0053966 A1* | 2/2014 | Gooch et al. .................... 156/64 |

OTHER PUBLICATIONS

Final Office Action for related U.S. Appl. No. 13/326,604 dated Aug. 28, 2013.

Notice of Allowance for related U.S. Appl. No. 13/326,604 dated Nov. 1, 2013, 11 pages.

* cited by examiner

US 8,872,289 B2

MICRO-ELECTRO-MECHANICAL SYSTEM (MEMS) STRUCTURES AND DESIGN STRUCTURES

FIELD OF THE INVENTION

The invention relates to semiconductor structures and methods of manufacture and, more particularly, to Micro-Electro-Mechanical System (MEMS) structures, methods of manufacture and design structures.

BACKGROUND

Integrated circuit switches used in integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs) and their low insertion loss (i.e. resistance) at frequencies of 10 GHz and higher. MEMS switches can be used in a variety of applications, primarily analog and mixed signal applications. One such example is cellular telephone chips containing a power amplifier (PA) and circuitry tuned for each broadcast mode. Integrated switches on the chip would connect the PA to the appropriate circuitry so that one PA per mode is not required.

Depending on the particular application and engineering criteria, MEMS structures can come in many different forms. For example, MEMS can be realized in the form of a cantilever structure. In the cantilever structure, a cantilever arm (suspended electrode) is pulled toward a fixed electrode by application of a voltage. The voltage required to pull the suspended electrode to the fixed electrode by electrostatic force is called pull-in voltage, which is dependent on several parameters including the length of the suspended electrode, spacing or gap between the suspended and fixed electrodes, and spring constant of the suspended electrode, which is a function of the materials and their thickness.

MEMS can be manufactured in a number of ways using a number of different tools. In general, though, the methodologies and tools are used to form small structures with dimensions in the micrometer scale with switch dimensions of approximately 5 microns thick, 100 microns wide, and 200 microns long. Also, many of the methodologies, i.e., technologies, employed to manufacture MEMS have been adopted from integrated circuit (IC) technology. For example, almost all MEMS are built on wafers and are realized in thin films of materials patterned by photolithographic processes on the top of the wafer. In particular, the fabrication of MEMS uses three basic building blocks: (i) deposition of thin films of material on a substrate, (ii) applying a patterned mask on top of the films by photolithographic imaging, and (iii) etching the films selectively to the mask.

For example, in MEMS cantilever type switches, the fixed electrodes and suspended electrode are typically manufactured using a series of conventional photolithographic, etching and deposition processes. In one example, the cantilever arm (suspended electrode) of the switch is formed using several successive deposition, masking and etching steps, after the fixed electrode is formed on a substrate. These steps and particularly the many masking steps that are required to form the cantilever arm (suspended electrode) are very expensive and time consuming. Also, due to the many masking steps, it is very difficult to achieve a vertical alignment of the edges of the materials, e.g., metal/oxide/metal layers, which form the cantilever arm (suspended electrode).

Accordingly, there exists a need in the art to overcome the deficiencies and limitations described hereinabove.

SUMMARY

In a first aspect of the invention, a method comprises forming a first metal layer on an at least a first insulator layer coating an underlying first sacrificial material. The method further comprises forming a second insulator layer on the first metal layer. The method further comprises forming a second metal layer on the insulator layer. The method further comprises forming a third insulator layer on the second metal layer. The method further comprises forming a mask on the third insulator layer to protect portions of the third insulator layer, the second metal layer, the second insulator layer, the first insulator layer and the first metal layer. The mask is further formed with an opening that partially overlaps with the underlying first sacrificial material. The method further comprises, in single removal process, removing exposed portions of the first insulator layer, the second insulator layer, and third insulator layer, and the first metal layer and the second metal layer, to form a beam structure, and to expose the overlapped portion of the underlying first sacrificial material. The method further comprises forming a second sacrificial material over the beam structure and in contact with the exposed portion of the underlying first sacrificial material. The method further comprises providing a lid on the second sacrificial material. The method further comprise venting, through the lid, the second sacrificial material and the underlying first sacrificial material to form an upper and lower chamber about the beam structure.

In another aspect of the invention, a method of forming a beam structure comprises layering metal and insulator materials on a sacrificial material formed on a substrate. The method further comprises masking the layered metal and insulator materials. The method further comprises forming an opening in the masking which overlaps with the sacrificial material. The method further comprises etching the layered metal and insulator materials in a single etching process to form the beam structure, such that edges of the layered metal and insulator material are aligned. The method further comprises forming a cavity about the beam structure through a venting.

In yet another aspect of the invention, a structure comprises a composite beam structure having self aligned edges and located between an upper chamber and a lower chamber.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the Micro-Electro-Mechanical System (MEMS) structures, which comprises the structures of the present invention. In still further embodiments, a method in a computer-aided design system is provided for generating a functional design model of the Micro-Electro-Mechanical System (MEMS) structures. The method comprises generating a functional representation of the structural elements of the Micro-Electro-Mechanical System (MEMS) structures.

More specifically, in embodiments of the present invention, a method in a computer-aided design system for generating a functional design model of a MEMS structure is provided. The method comprises generating a functional representation of a composite beam structure having self aligned edges and located between an upper chamber and a lower chamber.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to Micro-Electro-Mechanical System (MEMS) structures, methods of manufacture and design structures. More specifically, in embodiments, the present invention relates to structures and respective processing steps of forming a composite beam, e.g., metal/oxide/metal, for a MEMS device. Advantageously, the present invention eliminates the use of many masks for the formation of the composite beam, by using a single mask to remove unwanted portions of each of metal/oxide/metal layers. By using a single mask, it is possible to have respective edges of the metal/oxide/metal layers at one side of the beam coincident with each other (i.e., vertically self-aligned). The single mask step also forms a first edge of a via (e.g., "lower to upper cavity via") aligned with the coincident edges of the metal/oxide/metal layers that form the composite beam structures.

Figure 1:
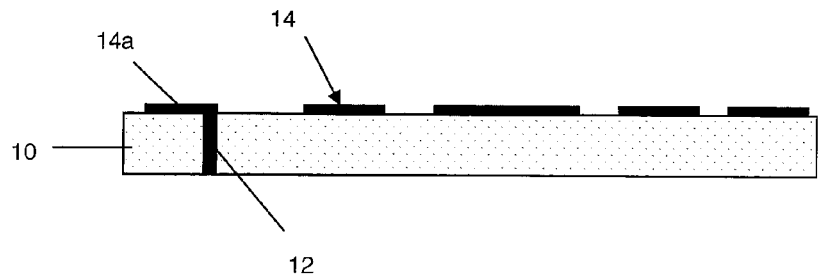
FIGS. 1-6 show structures and respective processing steps in accordance with aspects of the present invention.

FIG. 1 shows a structure and related processing steps in accordance with aspects of the invention. The structure includes, for example, a substrate 10. The substrate 10, in embodiments, can be any layer of a device. In embodiments, the substrate 10 is an oxide or other insulator material known to those of skill in the art. An interconnect 12 is provided within the substrate 10. The interconnect 12 can be, for example, a tungsten or copper stud formed in a conventionally formed via. For example, the interconnect 12 can be formed using any conventional lithographic, etching and deposition process, known to those of skill in the art for forming studs. As should be known to those of skill in the art, the substrate 10 can be implemented in either an SOI wafer or BULK implementation, or could be an insulating substrate such as sapphire or silica glass.

In FIG. 1, a wiring layer is formed on the substrate 10 to form multiple wires 14 using conventional deposition and patterning processes. For example, a wiring layer can be deposited on the substrate to a depth of about 0.25 microns; although other dimensions are also contemplated by the present invention. Thereafter, the wiring layer is patterned to form the wires 14. At least one of the wires 14a is in contact (direct electrical contact) with the interconnect 12. In embodiments, the wires 14 can be formed from aluminum; although other wiring materials are also contemplated by the present invention. For example, the wires 14 can be a refractory metal such as Ti, TiN, TaN, Ta, and W, or AlCu, AlCuSi, amongst other wiring materials.

Figure 2:
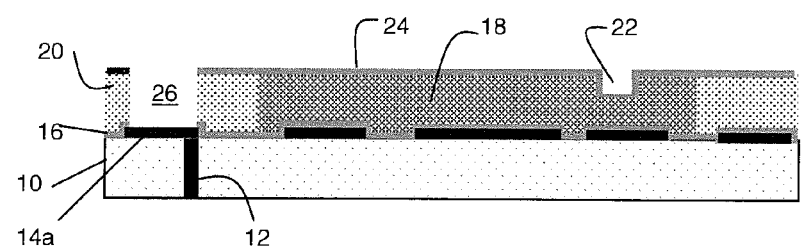

In FIG. 2, an insulator material 16 is formed on the multiple wires 14 and exposed portions of the substrate 10. In embodiments, the insulator material 16 is an oxide deposited to about 50 nm; although other dimensions are also contemplated by the present invention. A layer of sacrificial material 18 such as, for example, silicon is deposited on the insulator material 16. The sacrificial material 18 can be deposited using a conventional plasma vapor deposition (PVD), plasma enhanced chemical vapor deposition (PECVD), or any known process. In embodiments, the sacrificial material 18 is deposited to a height of about 2 microns (2 μm), and is patterned using conventional lithographic and reactive ion etching (RIE) steps. As optional processing steps, the sacrificial material 18 can be polished using, for example, a chemical mechanical polishing (CMP) and then additional sacrificial material (silicon) can be deposited on the polished sacrificial material 18.

Referring still to FIG. 2, an insulator material (e.g., oxide) 20 is deposited on the sacrificial material 18. The deposition can be, for example, a conventional conformal deposition process, e.g., chemical vapor deposition (CVD), depositing the insulator material 20 to a depth of about 2.3 μm to about 3.3 μm. The insulator material 20 can be polished, e.g., planarized using a CMP process, to achieve a planar surface with the sacrificial material 18.

In embodiments, the insulator material 20 can undergo a reverse etch (reverse damascene process). More specifically, a resist can be deposited on the insulator material 20, which is patterned to form an opening, with the resist edges overlapping with edges of the underlying sacrificial material 18. That is, the resist will slightly mask the underlying sacrificial material 18, resulting in a reverse image of the patterned sacrificial material 18. The insulator material 20 is then planarized, e.g., to be planar (e.g., flat or planar surface) with the underlying sacrificial material 18. That is, in embodiments, the insulator material 20 can be etched to the underlying sacrificial material 18. This planarization process will also planarize the underlying sacrificial material 18. The planarization process can be, for example, a CMP process.

Still referring to FIG. 2, one or more trenches 22 can be formed in the sacrificial material 18, over wirings 14. In embodiments, the trenches 22 are formed to a depth of about 0.3 μm; although other dimensions are contemplated by the invention depending on the design parameters and, more particularly, the height of the sacrificial material 18. A capacitor oxide deposition is performed on the exposed surfaces, e.g., on the sacrificial material 18, insulator material 20 and as a liner in the trench 22. In this deposition step, the insulator material 24, e.g., oxide, can be deposited to a height of about 80 nm; although other dimensions are contemplated by the present invention. A via 26 can be formed in the insulator material 20 to the underlying wire 14a, using conventional lithographic and etching processes.

Figure 3:
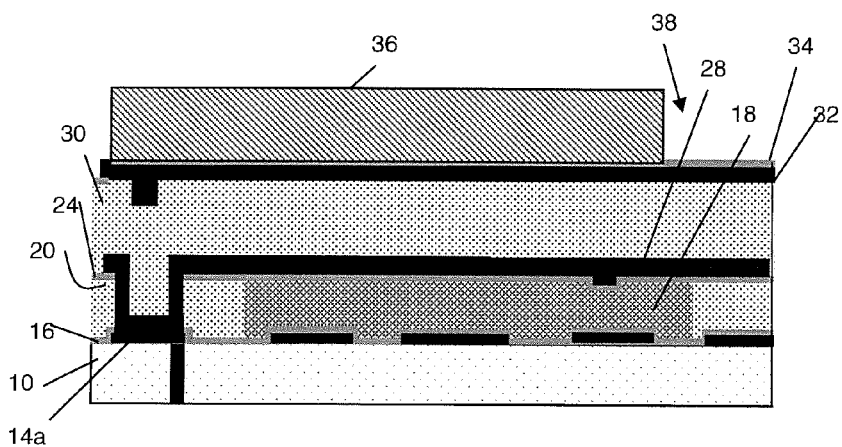

As shown in FIG. 3, an electrode 28 is formed over the insulator material 24, and also deposited within via 26 to contact the underlying wire 14a. The electrode 28 can also be deposited in the one or more trenches 22. In embodiments, the electrode 28 can be, for example, AlCu or AlCuSi; although other materials are also contemplated by the invention. In embodiments, for example, the electrode 28 can be a TiN, TaN, Ta or W, amongst other materials. The thicknesses of this and other electrodes and/or wires can vary depending on the specific design parameters. An insulator material 30 is formed on the electrode 28. In embodiments, the insulator material 30 is conformally deposited over the electrode 28. In embodiments, the insulator material 30 is a PECVD TEOS (oxide) that is deposited to a height of about 2 μm; although other dimensions are also contemplated by the present invention.

Still referring to FIG. 3, an upper electrode 32 is formed over the insulator material 30. In embodiments, the upper electrode 32 can be, for example, AlCu; although other materials are contemplated by the invention. In embodiments, for example, the upper electrode 32 can be TiN, TaN, Ta, or W, amongst other materials, and should be a thickness which balances the overall volume of the device, and hence not place undue stresses on the beams of the MEMS structures. In other words, the thickness of the electrode 32 should be the same or substantially the same as the thickness of the electrode 28. An insulator material (capacitor oxide) 34 is deposited on the electrode 32. In embodiments, the insulator material 34 is deposited to a height of about 80 nm; although other dimensions are also contemplated by the present invention.

A resist (e.g., mask layer) 36 is formed on the insulator material 34. In embodiments, the resist 36 is patterned to form one or more opening 38. The opening 38 is formed by conventional lithographic and etching processes, as is known to those of skill in the art. In embodiments, the opening 38 will slightly overlap with the underlying sacrificial material 18.

Figure 4:
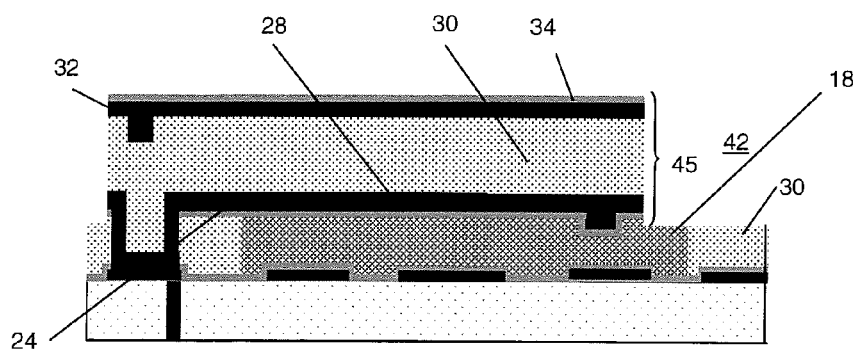

In FIG. 4, a beam structure (suspended electrode) 45 is formed by removing portions of the following materials: insulator material 34, electrode 32, insulator material 30, electrode 28, insulator material 24 and insulator material 20. More specifically, portions of layers 34, 32, 30, 28, 24 and 20 are removed in a single etching step using the mask layer 36. In this way, the beam structure (suspended electrode) 45 comprising the electrode 32, insulator material 30, and electrode 28 (and, in embodiments, insulator materials 24 and 30) can be formed in a single masking step, compared to multiple masking steps in conventional processes. Also, by using a single mask, it is possible to have respective edges of the metal/insulator/metal layers to have coincident edges (i.e., vertically self-aligned). The single mask step also forms a first edge of via 42 (e.g., "lower to upper cavity via") aligned with the coincident edges of the metal/oxide/metal layers that form the composite beam structure 45. The single etching step would use appropriate etch chemistries, such as perfluorcarbon-based for oxide and chlorine-based for metals, for each layer and, in embodiments, would use reactive ion etching (RIE). The RIE steps could be performed in a single RIE chamber or in multiple RIE chambers.

Figure 4A:
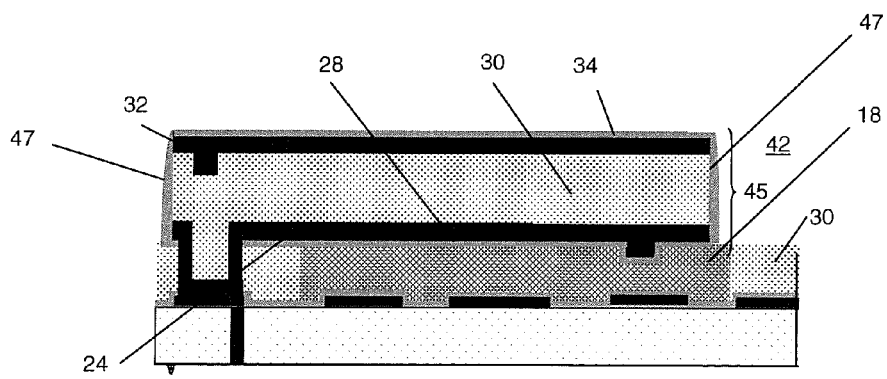

In FIG. 4a, an optional insulator spacer 47 is formed on the sidewall of the exposed beam 45. An insulator spacer could be formed by depositing 100 nm of PECVD SiO$_2$ oxide followed by a directional etch back to remove the oxide from flat surfaces while leaving it on vertical surfaces, as known in the art. The purpose of the oxide spacer 47 is to protect the metal in layers 28 and 32 from reacting with subsequent sacrificial layer 44 (see, FIG. 5). Note that the optional spacer etchback would etch some or all of insulator layer 34, so the as deposited thickness of insulator layer 34 would need to be adjusted so that it's final thickness was at the target value.

Figure 5:
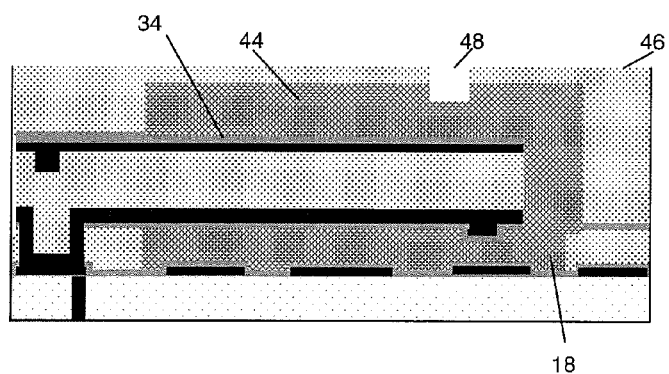

In FIG. 5, a sacrificial material 44 is deposited on the structure. More specifically, the sacrificial material 44 such as, for example, silicon, is deposited on the insulator material 32 and within via 42. The sacrificial material 44 can be deposited using a conventional conformal process, e.g., PVD or PECVD process, as discussed above. In embodiments, the sacrificial material 44 is deposited in contact with exposed portions of the sacrificial material 18, and is deposited to a height of about 4 microns (4 μm), and is patterned using conventional lithographic and reactive ion etching (RIE) steps. As optional processing steps, the sacrificial material 44 can be polished using, for example, a chemical mechanical polishing (CMP) and then additional sacrificial material (silicon) can be deposited on the polished sacrificial material 44. In embodiments, due to Hf acid cleaning, there will be no oxide between the two layers of sacrificial material (e.g., layer 18 and layer 44).

As further shown in FIG. 5, after patterning of the sacrificial material 44, an insulator layer 46, e.g., oxide material, is deposited on the sacrificial material 44 (and other exposed layers). The deposition process can be, for example, a conventional conformal deposition process, depositing the insulator layer 46 to a depth of about 2.3 μm to about 3.3 μm. The insulator layer 46 can then undergo a CMP process and/or reverse etch (reverse damascene process) as discussed above. In embodiments, a vent hole 48 is opened in the insulator layer 46, exposing a portion of the underlying sacrificial material 44. It should be understood that more than one vent hole 48 can be formed at several locations, to expose portions of the upper sacrificial material 44 and the lower sacrificial material 18 or both materials 18 and 44, using conventional lithographic and etching processes known to those of skill in the art. In embodiments, the structure, and in particular, the exposed sacrificial material 44, can be cleaned with an HF solution.

Figure 6:
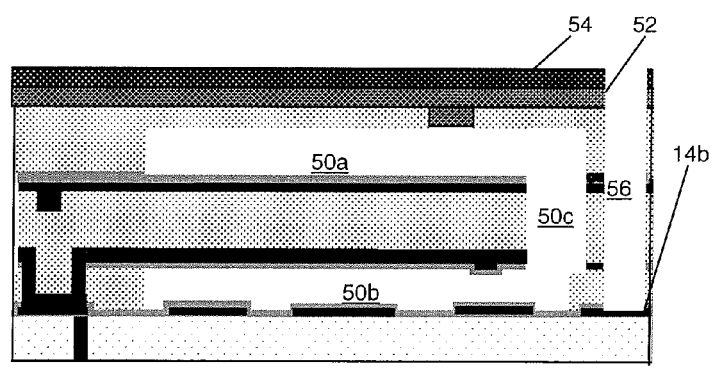

In FIG. 6, the sacrificial materials 18 and 44 are stripped or vented by way of the vent hole 48. In embodiments, the stripping (e.g., etching) can be performed using a XeF$_2$ etchant through the vent hole 48. The etching will strip all of the sacrificial material (e.g., silicon), forming an upper cavity 50a, a lower cavity 50b and a connecting via 50c. The vent hole 48 can be sealed with a dielectric or conductive material 52. For example, in embodiments, a PECVD process can form a layer of about 1.07 μm. A second deposition process, e.g., SACVD, can be performed to form a layer of about 0.7 μm. In further embodiments, a nitride cap 54 is deposited on the dielectric material 52. In embodiments, the nitride cap 54 can be about 0.5 μm. A final via 56 is then formed, exposing the underlying wiring layer 14b. The final via 56 is formed on the side of the cavities 50a, 50b and via 50c. Contacts can then be formed to the exposed wiring layer 14b, using conventional deposition processes and materials.

Figure 7:
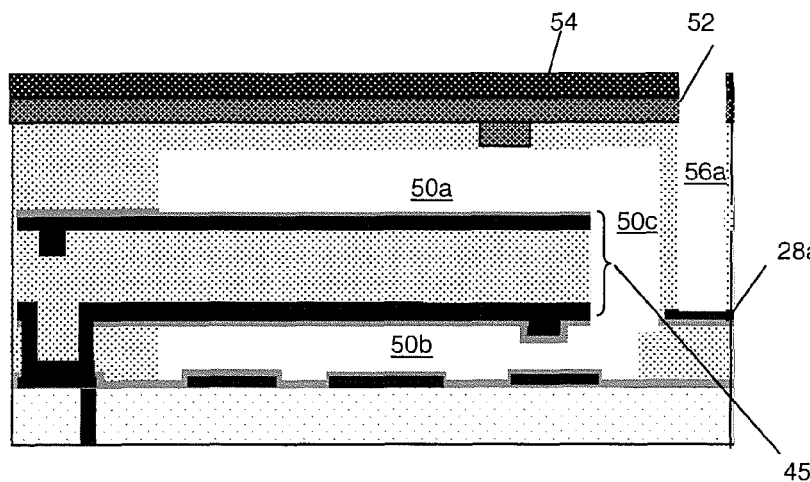
FIG. 7 shows a structure and respective processing steps in accordance with additional aspects of the present invention.

FIG. 7 shows structures and respective processing steps in accordance with additional aspects of the present invention. In this alternative embodiment, the final via 56a is etched down to metal layer 26a, which connects to lower wire level 14 through a via 26 similar to the ones in FIGS. 1-2 (not shown). Metal layer 28a is formed by a deposition and patterning step. It should be understood by those of ordinary skill in the art, that processes noted above can be implemented to form the remaining structures/layers of shown in FIG. 7. Contacts can then be formed to the exposed wiring layer 28a, using conventional deposition processes and materials.

Figure 8:
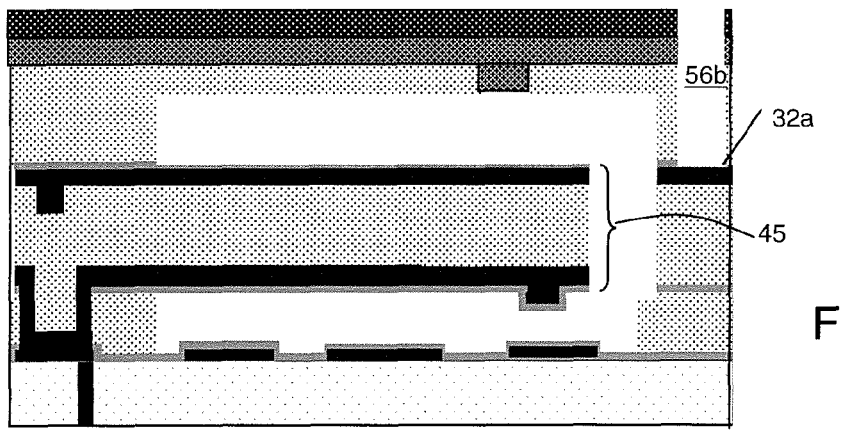
FIG. 8 shows a structure and respective processing steps in accordance with additional aspects of the present invention.

FIG. 8 shows a structure and respective processing steps in accordance with additional aspects of the present invention. In this structure, the through via 56 extends to upper wiring layer 32a, formed by a deposition and patterning step. The formation of the upper wiring layer 32a can be similar to that of the wiring layer 28a, but at an upper level of the structure. It should be understood by those of ordinary skill in the art, that processes noted above can be implemented to form the remaining structures/layers of shown in FIG. 8. Contacts can then be formed to the exposed wiring layer 32a, using conventional deposition processes and materials.

Figure 9:
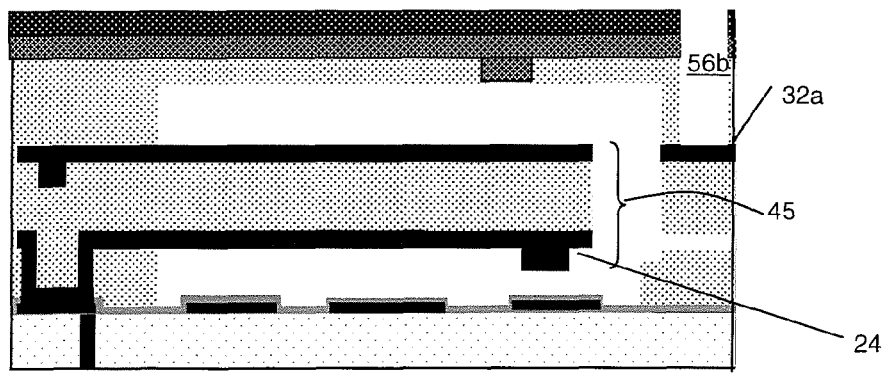
FIG. 9 shows a structure and respective processing steps in accordance with additional aspects of the present invention.

FIG. 9 shows a structure and respective processing steps in accordance with additional aspects of the present invention. More specifically, FIG. 9 shows the structure of FIG. 8, without the insulator material 24 provided in the trench 22. To form this structure, the insulator material 24 is deposited prior to the formation of the trench 22. After the trench formation, the lower electrode material 28 is deposited within the trench. It should be understood by those of ordinary skill in the art, that processes noted above can be implemented to form the remaining structures/layers of shown in FIG. 9.

As should be understood by those of skill in the art, the elimination of the insulator material within the trench 22 is equally applicable for all of the aspects of the present invention, described herein. Moreover, the present invention also contemplates the complete elimination of the insulator material 24 below the electrode 28, and the insulator material 34 above the electrode 32. In such examples, the beam structure 45 would comprise a metal, insulator and metal configuration. This configuration is shown in FIG. 9 for clarity purposes.

Other options include forming a via between metal layers 24 and 32 (see FIG. 3) to reduce the resistance; and patterning metal layer 24 prior to deposition insulator layer 30 (see FIG. 3). These options add additional masks but still retain the reduced mask count and self-aligned nature of this invention disclosure.

Figure 10:
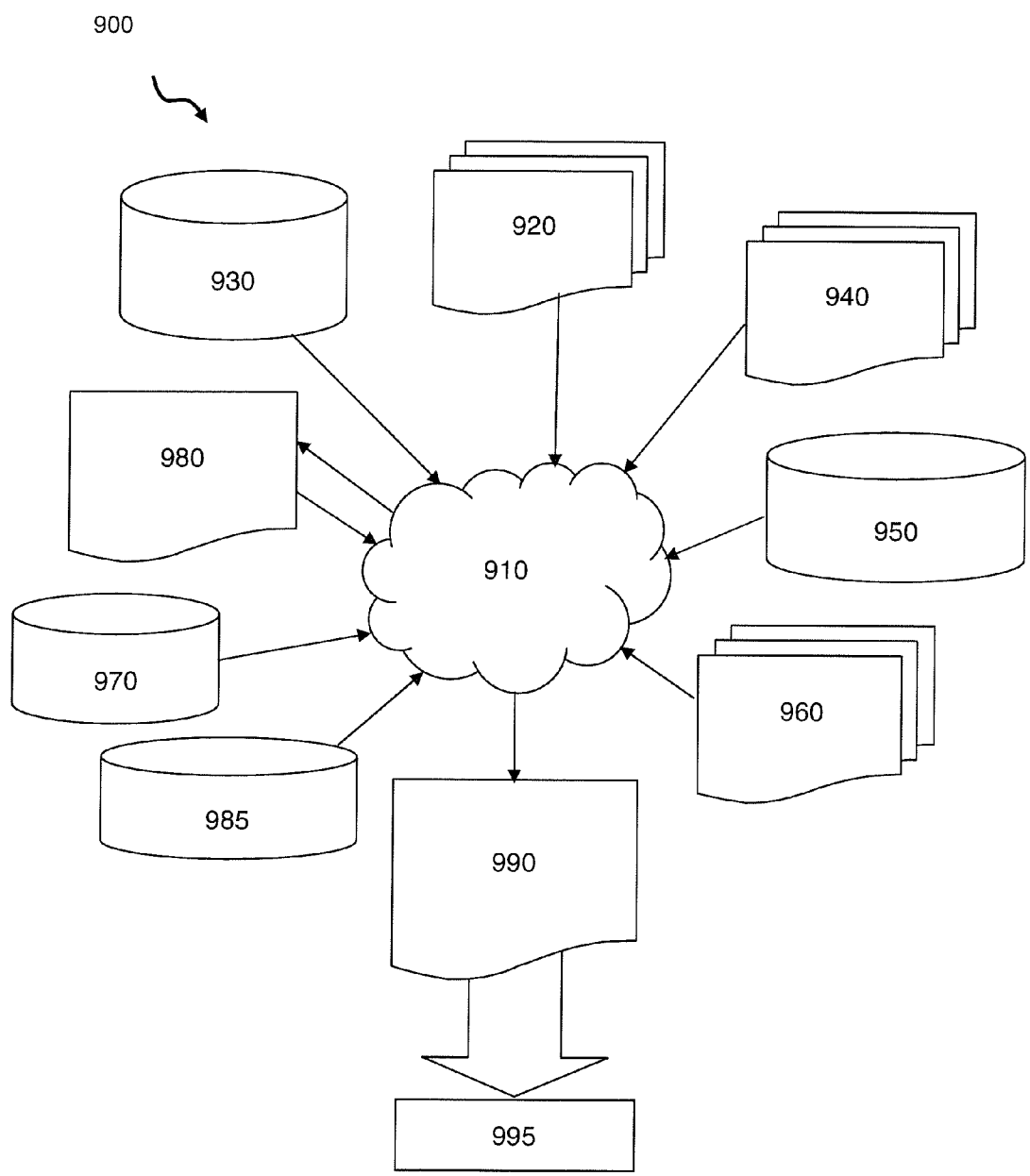
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the market place, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A Micro-Electro-Mechanical System (MEMS) structure comprising:
    a composite beam structure having self aligned edges and located between an upper chamber and a lower chamber, wherein the composite beam structure comprises:
        a first insulator layer;
        a first metal layer on the first insulator layer;
        a second insulator layer on the first metal layer;
        a second metal layer on the second insulator layer; and
        a third insulator layer on the second metal layer; and
    an oxide bump extending below the first metal layer, and facing a fixed electrode formed on a substrate.

2. The Micro-Electro-Mechanical System (MEMS) structure of claim 1, wherein the second insulator layer is oxide.

3. The Micro-Electro-Mechanical System (MEMS) structure of claim 1, further comprising a wiring on a same level as the first metal layer.

4. The Micro-Electro-Mechanical System (MEMS) structure of claim 1, further comprising:
    a connecting via adjacent to the self aligned edges connecting the upper chamber and the lower chamber;
    a fourth insulator layer on a side of the upper chamber, the lower chamber, and the connecting via;
    an upper wiring layer in the fourth insulator layer, wherein the upper wiring layer is on a same level as the second metal layer; and
    a second via in the fourth insulator layer extending from an upper surface of the MEMS structure to the upper wiring layer.

5. The Micro-Electro-Mechanical System (MEMS) structure of claim 1, wherein the composite beam structure is a cantilever beam.

6. The Micro-Electro-Mechanical System (MEMS) structure of claim 4, wherein the upper wiring layer is remote from the composite beam structure.

7. The Micro-Electro-Mechanical System (MEMS) structure of claim 6, wherein the upper wiring layer is separated from the composite beam structure by the connecting via forming a cavity surrounding the composite beam structure.

8. The Micro-Electro-Mechanical System (MEMS) structure of claim 7, wherein the second via is formed above the upper wiring layer.

9. The Micro-Electro-Mechanical System (MEMS) structure of claim 7, further comprises an underlying wiring layer on the fourth insulator layer and the underlying wiring is formed from a same metal as the first metal layer of the composite beam structure.

10. The Micro-Electro-Mechanical System (MEMS) structure of claim 9, wherein the second via is formed above the underlying wiring layer.

* * * * *